(12) United States Patent
Kamada et al.

(10) Patent No.: US 11,581,197 B2
(45) Date of Patent: Feb. 14, 2023

(54) METHOD FOR PRODUCING SEMICONDUCTOR DEVICE AND INTERMEDIATE FOR SEMICONDUCTOR DEVICE

(71) Applicant: Mitsui Chemicals, Inc., Tokyo (JP)

(72) Inventors: Jun Kamada, Narashino (JP); Kaichiro Haruta, Ichihara (JP); Yasuhisa Kayaba, Urayasu (JP); Kazuo Kohmura, Chiba (JP); Yoichi Kodama, Kawasaki (JP)

(73) Assignee: MITSUI CHEMICALS, INC., Tokyo (JP)

( * ) Notice: Subject to any disclaimer, the term of this patent is extended or adjusted under 35 U.S.C. 154(b) by 43 days.

(21) Appl. No.: 16/611,653

(22) PCT Filed: May 10, 2018

(86) PCT No.: PCT/JP2018/018069
§ 371 (c)(1),
(2) Date: Nov. 7, 2019

(87) PCT Pub. No.: WO2018/207862
PCT Pub. Date: Nov. 15, 2018

(65) Prior Publication Data
US 2020/0168476 A1 May 28, 2020

(30) Foreign Application Priority Data

May 10, 2017 (JP) .............................. JP2017-093599

(51) Int. Cl.
*H01L 21/56* (2006.01)
*H01L 23/29* (2006.01)

(52) U.S. Cl.
CPC .......... *H01L 21/568* (2013.01); *H01L 21/561* (2013.01); *H01L 23/293* (2013.01)

(58) Field of Classification Search
CPC ..................................................... H01L 21/568
(Continued)

(56) References Cited

U.S. PATENT DOCUMENTS

| | | |
|---|---|---|
| 2002/0011655 A1 | 1/2002 | Nishiyama et al. |
| 2005/0009259 A1 | 1/2005 | Farnworth |

(Continued)

FOREIGN PATENT DOCUMENTS

| | | |
|---|---|---|
| JP | H08293509 A | 11/1996 |
| JP | 2001308116 A | 11/2001 |

(Continued)

OTHER PUBLICATIONS

The extended European Search Report dated Nov. 2, 2020, by the European Patent Office in corresponding European Patent Application No. 18797739.2-1212. (11 pages).

(Continued)

*Primary Examiner* — Hsin Yi Hsieh
(74) *Attorney, Agent, or Firm* — Buchanan, Ingersoll & Rooney PC

(57) ABSTRACT

This method for producing a semiconductor device comprises: a first step wherein a plurality of semiconductor chips are affixed onto a supporting substrate such that circuit surfaces of the semiconductor chips face the supporting substrate; a second step wherein a plurality of sealed layers are formed at intervals by applying the sealing resin onto the semiconductor chips by three-dimensional modeling method, each sealed layer containing one or more semiconductor chips embedded in a sealing resin; a third step wherein the sealed layers are cured or solidified; and a fourth step wherein sealed bodies are obtained by separating the cured or solidified sealed layers from the supporting substrate.

11 Claims, 4 Drawing Sheets

(58) Field of Classification Search
USPC .......................................................... 438/127
See application file for complete search history.

(56) References Cited

U.S. PATENT DOCUMENTS

| | | | |
|---|---|---|---|
| 2009/0053850 A1* | 2/2009 | Nishida | H01L 27/14618 |
| | | | 257/E21.001 |
| 2010/0019370 A1* | 1/2010 | Pressel | H01L 25/50 |
| | | | 257/690 |
| 2010/0206462 A1 | 8/2010 | Binkley | |
| 2013/0069219 A1* | 3/2013 | Uchiyama | H01L 25/0657 |
| | | | 257/734 |
| 2015/0147845 A1 | 5/2015 | Poddar et al. | |
| 2015/0206830 A1* | 7/2015 | Takada | H01L 24/92 |
| | | | 257/676 |
| 2015/0357256 A1* | 12/2015 | Suthiwongsunthorn | |
| | | | H01L 21/78 |
| | | | 257/734 |
| 2016/0211228 A1* | 7/2016 | Morita | H01L 24/19 |
| 2017/0148744 A1* | 5/2017 | Carson | H01L 21/561 |

FOREIGN PATENT DOCUMENTS

| | | |
|---|---|---|
| JP | 2012-199342 A | 10/2012 |
| WO | 2016/031684 A1 | 3/2016 |

OTHER PUBLICATIONS

International Search Report (PCT/ISA/210) dated Jul. 17, 2018, by the Japanese Patent Office as the International Searching Authority for International Application No. PCT/JP2018/018069.

Written Opinion (PCT/ISA/237) dated Jul. 17, 2018, by the Japanese Patent Office as the International Searching Authority for International Application No. PCT/JP2018/018069.

* cited by examiner

METHOD FOR PRODUCING SEMICONDUCTOR DEVICE AND INTERMEDIATE FOR SEMICONDUCTOR DEVICE

TECHNICAL FIELD

The present invention relates to a method for producing a semiconductor apparatus and an intermediate of the semiconductor apparatus.

BACKGROUND ART

Hitherto, semiconductor devices (semiconductor chips) such as an IC using a silicon semiconductor or an organic EL device using an organic semiconductor are generally produced by forming many devices on a wafer substrate surface in a matrix form and then dividing the devices into individual devices by dicing. In general, the semiconductor chips are packaged by being applied with resin sealing and the like, and are mounted on various electronic devices.

As a packaging technology for the semiconductor chips, in recent years, a technology called fan-out wafer-level packaging is proposed (for example, see Patent Literature (hereinafter, abbreviated as PTL) 1). In the fan-out wafer-level packaging, a rear surface side (a side opposite to the circuit surface) of the semiconductor chip is sealed with resin. Then, a re-distribution layer is formed on a front surface (circuit surface) of the semiconductor chip, and an external terminal is further Ruined on the re-distribution layer.

A large-area packaging technology is needed in terms of cost reduction. In particular, collective sealing of a plurality of semiconductor chips and collective formation of an RDL (re-distribution layer) in a large area that is a high-cost process are needed.

Meanwhile, PTL 1 discloses a method for producing a semiconductor apparatus through (1) a step of fixing a plurality of semiconductor chips on a supporting substrate so that front surfaces (circuit surfaces) thereof face down; (2) a step of collectively sealing rear surfaces of the plurality of semiconductor chips with a sealing material; (3) a step of obtaining a sealed body by removing the supporting substrate; (4) a step of forming re-distribution layers on front surfaces (circuit surfaces) of the semiconductor chips of the sealed body that are exposed, and further forming external connection terminals such as metal bumps thereon; and (5) a step of dividing the semiconductor chips into individual semiconductor chips or packages each formed from a plurality of semiconductor chips.

CITATION LIST

Patent Literature

PTL 1
Japanese Patent Application Laid-Open No. 2001-308116

SUMMARY OF INVENTION

Technical Problem

However, in the step of the resin sealing step (2) in PTL 1, the sealing resin is formed on the entire surface of the supporting substrate including places between the plurality of semiconductor chips. As described above, the contact area between the sealing material and the supporting substrate is large, and hence there has been a problem in that a warp is easily generated in the sealed body and misalignment (die shift) of the semiconductor chips easily occur due to the difference in the coefficient of thermal expansion between the sealing material and the supporting substrate at the time of sealing and when the supporting substrate is removed. As a result, there has been a fear that the handleability of the sealed body may be reduced and the reliability of the obtained semiconductor apparatus may be reduced after the sealing and removal.

The present invention has been made in view of the abovementioned situation, and an object thereof is to provide a method for producing a semiconductor apparatus and an intermediate of the semiconductor apparatus that may suppress a warp in a sealed body and misalignment of a plurality of semiconductor chips when the sealed body is obtained by collectively sealing the semiconductor chips, and suppress the reduction of the handleability of the sealed body and the reliability of the semiconductor apparatus after the sealed body is obtained.

Solution to Problem

The present invention relates to the following method for manufacturing a semiconductor apparatus and also to an intermediate of a semiconductor apparatus.

[1] A method for producing a semiconductor apparatus, the method comprising:
a first step of fixing a plurality of semiconductor chips on a supporting substrate so that circuit surfaces of the plurality of semiconductor chips face the supporting substrate;
a second step of forming, at intervals, a plurality of sealing layers by applying a sealing material containing a sealing resin on the semiconductor chips by a three-dimensional molding method, each sealing layer containing one or more semiconductor chips covered with the sealing material;
a third step of curing or solidifying the sealing layers; and
a fourth step of obtaining sealed bodies by removing the cured or solidified sealing layers from the supporting substrate.

[2] The method for producing the semiconductor apparatus according to [1], wherein a percentage of a minimum value of an interval between adjacent two of the sealing layers with respect to a maximum width of the sealing layer is 0.19% to 10% in the second step when the supporting substrate is seen in plan view.

[3] The method for producing the semiconductor apparatus according to [1] or [2], further comprising forming a plurality of frame bodies that surround the semiconductor chips on the supporting substrate, wherein the second step comprises forming the sealing layers by applying the sealing material on inner sides of the frame bodies, each sealing layer containing one or more semiconductor chips covered with the sealing material.

[4] The method for producing the semiconductor apparatus according to [3], wherein the frame bodies contain a material whose coefficient of linear expansion at a temperature of 60° C. to 250° C. is 35 ppm/K or less.

[5] The method for producing the semiconductor apparatus according to [3], wherein the frame bodies contain a resin whose tensile modulus of elasticity at a temperature of 60° C. to 250° C. is less than a tensile modulus of elasticity of the sealing material after curing or solidifying by 0.5 GPa or more.

[6] The method for producing the semiconductor apparatus according to any one of [1] to [5], wherein:
the sealing material is allowed to further contain a filling agent; and
a content percentage of the filling agent with respect to a total mass of the sealing material is 10 mass % or less.

[7] The method for producing the semiconductor apparatus according to any one of [1] to [6], wherein a coefficient of viscosity of the sealing material when the sealing material is applied on the semiconductor chips by the three-dimensional molding method is 1 mPa·s to 20 mPa·s.

[8] The method for producing the semiconductor apparatus according to any one of [1] to [7], wherein a glass transition temperature of the sealing layers is 110° C. or more.

[9] The method for producing the semiconductor apparatus according to any one of [1] to [8], wherein the sealing resin is at least one member selected from a group consisting of an epoxy resin, a polyimide resin, and a urea resin.

[10] The method for producing the semiconductor apparatus according to any one of [1] to [9], further comprising forming, by the three-dimensional molding method, a re-distribution layer on a surface of each of the sealed bodies on which one or more semiconductor chips are exposed.

[11] The method for producing the semiconductor apparatus according to any one of [1] to [10], further comprising forming, by the three-dimensional molding method, ground wire on outer peripheries of the semiconductor chips on a surface of each of the sealed bodies on which one or more semiconductor chips are exposed.

[12] The method for producing the semiconductor apparatus according to any one of [1] to [11], further comprising forming, by the three-dimensional molding method, an electromagnetic wave shield layer on at least one portion of a surface of each of the sealed bodies on which one or more semiconductor chips are not exposed.

[13] The method for producing the semiconductor apparatus according to any one of [1] to [12], wherein:
the sealed bodies each comprise a plurality of the semiconductor chips; and
the method further comprises cutting a place between the plurality of semiconductor chips included in each of the sealed bodies.

[14] An intermediate of a semiconductor apparatus, the intermediate comprising:
a supporting substrate;
a plurality of semiconductor chips fixed on the supporting substrate so that circuit surfaces face the supporting substrate; and
a plurality of sealing layers being disposed at intervals, each sealing layer containing one or more semiconductor chips embedded in a sealing material.

[15] The intermediate of the semiconductor apparatus according to [14], wherein a percentage of a minimum value of an interval between adjacent two of the sealing layers with respect to a maximum width of the sealing layer is 0.19% to 10% when the supporting substrate is seen in plan view.

[16] The intermediate of the semiconductor apparatus according to [15], wherein the minimum value of an interval between the sealing layers is 0.18 mm to 6 mm and the maximum width of each of the sealing layers is 10 mm to 60 mm.

Advantageous Effects of Invention

According to the present invention, the method for producing the semiconductor apparatus that may suppress the warp in the sealed body and the misalignment of the semiconductor chips when the sealed body is obtained by collectively sealing the semiconductor chips, and suppress the reduction of the handleability of the sealed body and the reliability of the semiconductor apparatus after the sealed body is obtained can be provided.

DESCRIPTION OF EMBODIMENTS

Figure 1A:
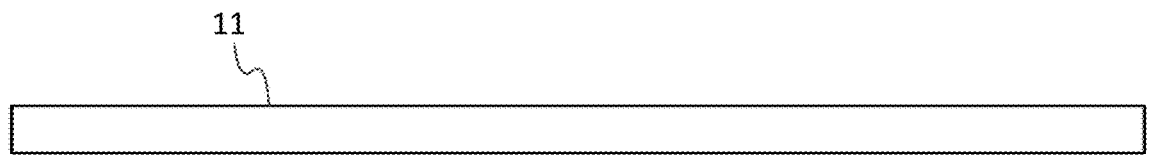
FIGS. 1A to 1E illustrate an example of a method for producing a semiconductor apparatus according to an embodiment.
Figure 1B:
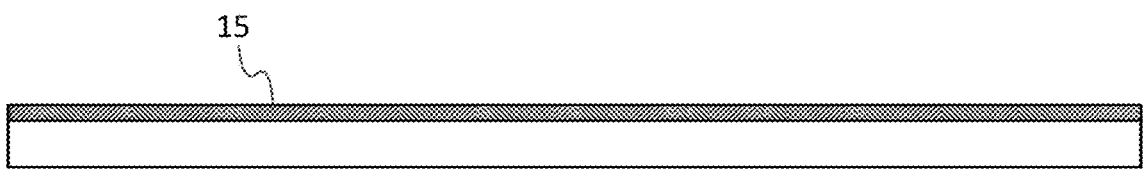
Figure 1C:
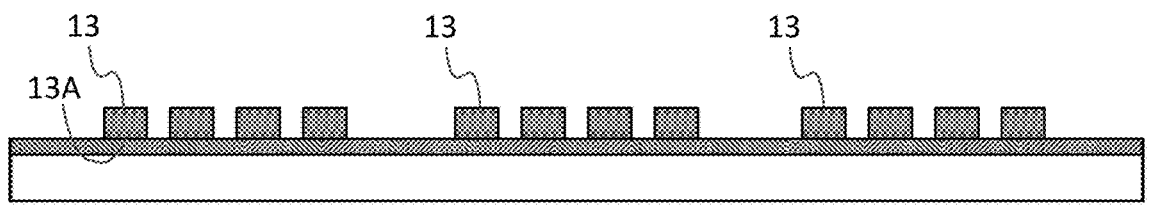
Figure 1D:
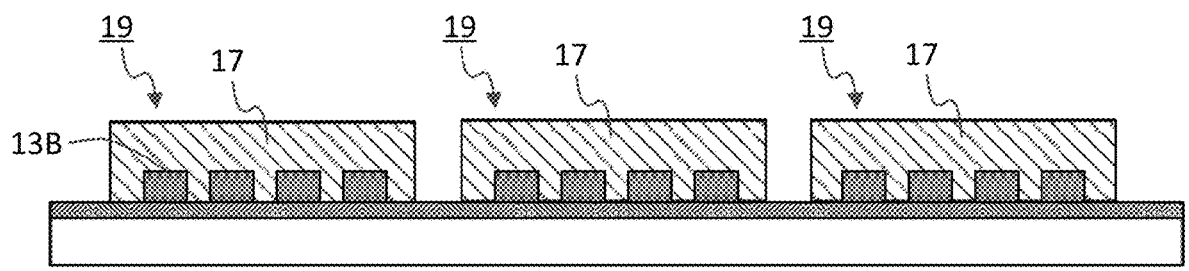

FIGS. 1A to 1I illustrate an example of a method for producing a semiconductor apparatus according to an embodiment of the present invention. The method for producing the semiconductor apparatus according to this embodiment includes a first step of fixing plurality of semiconductor chips 13 on supporting substrate 11; a second step of applying sealing material 17 to plurality of semiconductor chips 13, and forming plurality of sealing layers 19, each sealing layer 19 containing one or more semiconductor chips 13 covered with sealing material 17; a third step of curing or solidifying sealing layers 19; and a fourth step of obtaining sealed bodies 21 by removing cured or solidified sealing layers 19 from supporting substrate 11. The method for producing the semiconductor apparatus according to this embodiment may further include, as necessary, one or more other steps out of a step of forming re-distribution layer 23 on a surface of each obtained sealed body 21 on which one or more semiconductor chips are exposed, a step of Ruining bumps 25 on re-distribution layer 23, a step of fruiting ground wire on the outer peripheries of semiconductor chips 13 of obtained sealed body 21, and a step of forming an electromagnetic wave shield layer on a surface of obtained sealed body 21 on which one or more semiconductor chips 13 are not exposed. Note that the order of the other steps is not particularly limited. As described above, a method for producing a semiconductor apparatus by successively forming the re-distribution layer or an external terminal on a circuit surface of the semiconductor chip, as necessary, after sealing the side of semiconductor chip opposite to the circuit surface by resin is also referred to as a fan-out wafer-level packaging method.

Each step is described with reference to the accompanying drawings.

(First Step)

First, supporting substrate 11 is prepared (see FIG. 1A). Examples of supporting substrate 11 include glass substrates such as a quartz substrate and an alkali-free glass substrate, metal plates such as an SUS substrate, wafer substrates such as a silicon wafer, a SiC wafer, and a GaAs wafer, and resin substrates. Among the above, in terms of controlling the coefficient of thermal expansion in order to suppress the warp and the die shift of sealed bodies 21, the linear expansion coefficient is preferred to be low, and the glass substrates and the SUS substrate are preferred.

The thickness of supporting substrate 11 is not particularly limited, but may be 10 μm to 20 mm, for example, in terms of reducing the warp and the deformation of sealed bodies 21 even more and increasing the handleability. When the thickness of supporting substrate 11 is 10 μm or more, the warp and the deformation of sealed bodies 21 is much less likely to be generated in the production step, and conveyance trouble during the production step is less likely to occur, and hence productivity decline due to the decrease in the yield rate is less likely to occur. When the thickness of supporting substrate 11 is 20 mm or less, the weight does not become too heavy, and hence the conveyance is less likely to become difficult and excellent handleability is provided.

The size of supporting substrate 11 is not particularly limited, but the maximum width is preferred to be 5 cm to 50 cm, more preferred to be 10 cm to 30 cm (12 inches), and further preferred to be 10 cm to 20 cm (8 inches) in terms of reducing the warp and the deformation of sealed bodies 21 even more and improving the yield.

Next, plurality of semiconductor chips 13 are fixed on supporting substrate 11 so that front surfaces 13A (circuit surfaces) thereof are on supporting substrate 11 side. The method for fixing plurality of semiconductor chips 13 is not particularly limited, but can be performed, for example, by disposing adhesive sheet 15 on supporting substrate 11, and then further disposing plurality of semiconductor chips 13 on adhesive sheet 15 (see FIGS. 1B to 1C).

Examples of adhesive sheet 15 include a photocurable adhesive sheet that is cured and adhesive force thereof decreases by being irradiated with light, and a thermally-expandable adhesive sheet, which thermally expands and adhesive force thereof decreases by heating.

(Second Step)

Sealing material 17 containing a sealing resin is applied to rear surfaces 13B (surfaces on a side opposite to the circuit surfaces) of plurality of semiconductor chips 13 fixed on supporting substrate 11. As a result, plurality of sealing layers 19 are formed on supporting substrate 11 at intervals, and each sealing layer 19 contains one or more semiconductor chips 13 covered with sealing material 17.

Figure 2A:
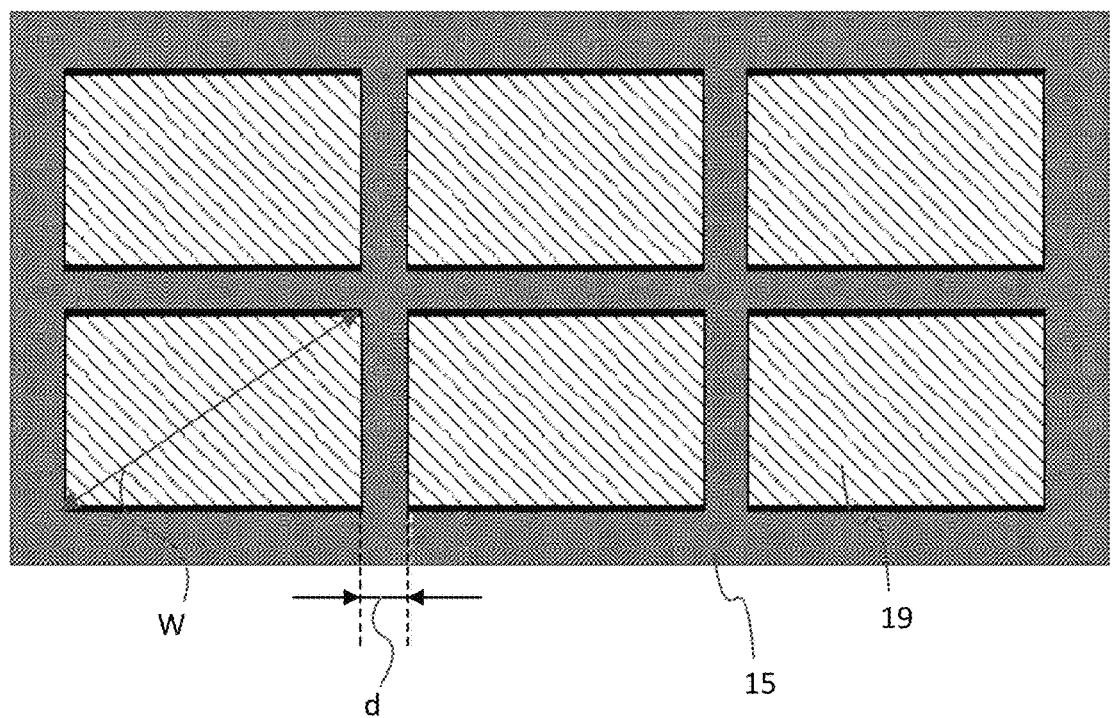
FIGS. 2A and 2B illustrate an example of a step of forming a plurality of sealing layers.
Figure 2B:
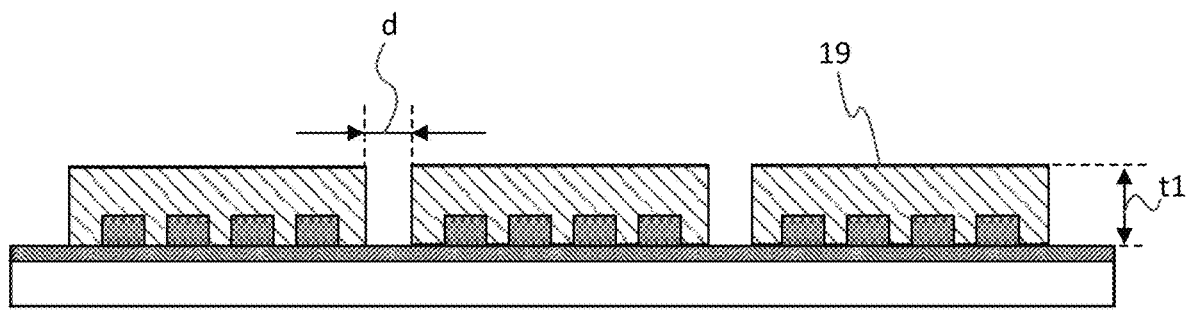

FIGS. 2A and 2B illustrate an example of a step of forming plurality of sealing layers 19. Out of FIGS. 2A and 2B, FIG. 2A is a plan view, and FIG. 2B is a cross-sectional view. As illustrated in FIGS. 2A and 2B, plurality of sealing layers 19 are formed on supporting substrate 11 at intervals. As a result, the contact area between supporting substrate 11 and each sealing layer 19 can be small, and hence the warp in sealed bodies 21 and the misalignment of semiconductor chips 13 due to the difference in the coefficient of linear expansion between supporting substrate 11 and sealing layers 19 (or sealing material 17) can be reduced.

The shape of sealing layer 19 is not particularly limited, and may be a rectangular shape or a circular shape, and is preferred to be a rectangular shape in terms of increasing the yield.

As described above, the misalignment of semiconductor chips 13 and the warp in sealed bodies 21 due to the difference in the coefficient of linear expansion between sealing layers 19 and supporting substrate 11 is proportional to the contact area between one continuous sealing layer 19 and supporting substrate 11.

When sealing material 17 includes "a thermosetting resin that causes (sealing layers 19)<(supporting substrate 11) to be satisfied in terms of the coefficient of linear expansion" as the sealing resin, the misalignment of semiconductor chips 13 easily occur and the warp is easily generated in sealed bodies 21 due to the difference in the shrinkage rate (the difference in the coefficient of linear expansion) between sealing layers 19 and supporting substrate 11 in a cooling process when sealing material 17 is cooled after being applied and cured by heating. In particular, when the shrinkage rate of supporting substrate 11 is larger than the shrinkage rate of sealing layers 19, the interval between adjacent sealing layers 19 is narrowed in the cooling process, thereby causing a fear of contact between adjacent sealing layers 19. When the contact as above occurs and adjacent sealing layers 19 are joined together to form one continuous sealing layer 19, the misalignment of semiconductor chips 13 and the warp in sealed bodies 21 increase in a much easier manner. Therefore, in order to reduce the misalignment of semiconductor chips 13 and the warp in sealed bodies 21, the contact between adjacent sealing layers 19 in the cooling process is desired to be suppressed.

When sealing material 17 includes "a thermosetting resin or a photocurable resin that causes (sealing layers 19)>(supporting substrate 11) to be satisfied in terms of the coefficient of linear expansion" as the sealing resin, the misalignment of semiconductor chips 13 easily occur and the warp is easily generated in sealed bodies 21 due to the difference in the expansion rate (the difference in the coefficient of linear expansion) between sealing layers 19 and supporting substrate 11 in the process of heating sealing material 17 after applying and curing sealing material 17. In particular, when the expansion rate of supporting substrate 11 is smaller than the expansion rate of sealing layer 19, the interval between adjacent sealing layers 19 is narrowed in the heating process after the curing, thereby causing a fear of contact between adjacent sealing layers 19. When the contact as above occurs and adjacent sealing layers 19 are joined together to faint one continuous sealing layer 19, the misalignment of semiconductor chips 13 and the warp in sealed bodies 21 increase in a much easier manner. Therefore, in order to reduce the misalignment of semiconductor chips 13 and the warp in sealed bodies 21, the contact between adjacent sealing layers 19 in the heating process after the curing is desired to be suppressed.

The percentage of minimum width d of the interval between sealing layer 19 and sealing layer 19 that are adjacent to each other in plan view with respect to maximum width W of sealing layer 19 ((minimum width d of the interval between sealing layer 19 and sealing layer 19)/(maximum width W of sealing layer 19)×100(%)) is preferred to be 0.19% to 10% of maximum width W of sealing layer 19. When the abovementioned percentage (d/W×100) is 0.19% or more, in the cooling process after the heating and curing and the heating process after the curing, the contact between adjacent sealing layers 19 caused by interval d between adjacent sealing layers 19 being narrowed can be suppressed to a high degree. As a result, the interval between sealing layer 19 and sealing layer 19 that are adjacent to each other is maintained, and hence the warp in sealed bodies 21 and the misalignment of semiconductor chips 13 due to the difference in the thermal expansion coefficient between supporting substrate 11 and sealing layers 19 can be suppressed to a high degree. When the abovementioned percentage (d/W×100) is 10% or less, the decrease in yield caused by the areas of sealing layers 19 becoming too small can be suppressed.

The abovementioned numeric range can be obtained with use of analysis software ANSYS and the like. In other words, the maximum value of the moving distance of semiconductor chips 13 in the cooling process after the heating and curing or the heating process after the curing when the materials of supporting substrate 11, semiconductor chips 13, and sealing layers 19 are combined in a predetermined manner is calculated with use of analysis software ANSYS. A value exceeding the obtained maximum value of the moving distance of semiconductor chips 13 is set as the minimum value of interval d between adjacent sealing layers 19, and is divided by maximum width W of sealing layer 19, to thereby compute the abovementioned percentage (d/W×100). The operation can be performed by changing the combination of the materials, and the minimum value out of the obtained percentages (d/W×100) can be set as the lower limit value of the abovementioned percentage (d/W×100).

As the combination of supporting substrate 11 and sealing layers 19, it is preferred that supporting substrate 11 be at least one type selected from an SUS substrate, a glass substrate, and a silicon wafer, and sealing layers 19 contain at least one type from a thermosetting resin and a photocurable resin, and it is more preferred that supporting substrate 11 be an SUS substrate and sealing layers 19 contain an epoxy resin. By setting the abovementioned percentage (d/W×100) to be 0.19% to 10% when the combination as above is used, a case where adjacent sealing layers 19 come into contact with each other in the cooling process after the heating and curing and the heating process after the curing can be easily suppressed, and the misalignment of semiconductor chips 13 and the warp in sealed bodies 21 can be suppressed in a much easier manner.

Maximum width W of sealing layer 19 differs according to the size of semiconductor chip 13, the producing apparatus, and the like, and is not particularly limited, but is preferred to be 10 mm to 60 mm, for example. When maximum width W of sealing layer 19 is 10 mm or more, a sufficient number of semiconductor chips 13 are easily disposed on one sealing layer 19. When maximum width W of sealing layer 19 is 60 mm or less, the contact area between one sealing layer 19 and supporting substrate 11 may be sufficiently reduced. Therefore, the warp in sealed bodies 21 and the misalignment of semiconductor chips 13 are sufficiently suppressed in an easy manner.

Minimum value d of the interval between sealing layer 19 and sealing layer 19 that are adjacent to each other is not particularly limited as long as the abovementioned percentage (d/W×100) is satisfied, but is preferred to be 0.18 mm to 6.0 mm, and more preferred to be 0.5 mm to 3.0 mm, for example. When minimum value d is within the abovementioned range, the suppression of the warp in sealed bodies 21 and the misalignment of semiconductor chips 13 and the yield of semiconductor chips 13 may be both achieved to a high degree.

Thickness t1 of sealing layer 19 only needs to be a thickness with which entire semiconductor chip 13 can be embedded after the curing or solidifying, and may be set so that the thickness after the curing or solidifying reaches about 0.1 mm to about 5 mm, for example (see FIG. 2B).

The absolute value of the difference in the coefficient of linear expansion between supporting substrate 11 and sealing material 17 is preferred to be 15 ppm/K or less, and is more preferred to be 9.3 ppm/K or less in terms of causing the misalignment of semiconductor chips 13 and the warp in sealed bodies 21 to be easily suppressed.

The number of semiconductor chips 13 included in one sealing layer 19 is preferred to be small in terms of suppressing the misalignment of semiconductor chips 13 and the warp in sealed bodies more by reducing the area of one continuous sealing layer 19. Specifically, the number of semiconductor chips 13 included in one sealing layer 19 is preferred to be one to ten, more preferred to be one to three, and particularly preferred to be one.

The formation of sealing layers 19, that is, the application of sealing material 17 is performed from a three-dimensional molding method. In the three-dimensional molding method, heat is less likely to be generated when sealing, curing, or solidifying are performed unlike a mold molding method such as transfer molding of the related art. As a result, the warp due to the difference in the coefficient of thermal expansion between supporting substrate 11 and sealing layers 19 may be suppressed, and the misalignment of semiconductor chips 13 may be suppressed.

The three-dimensional molding method is not particularly limited, but may be any of a stereo lithography method (STL method), a material jetting method (ink jet method), a fused deposition modeling method (FDM method), and a selective laser sintering method (SLS method).

The stereo lithography method (STL method) is a method of forming and depositing a resin layer on supporting substrate 11 on which plurality of semiconductor chips 13 are fixed that is disposed on a molding stage in a tank filled with a liquid photocurable resin composition by irradiating only a desired portion of a liquid surface of the tank with light.

The material jetting method (ink jet method) is a method of forming and depositing a resin layer by jetting out a liquid photocurable resin composition or thermosetting resin composition and curing the liquid photocurable resin composition that has been jetted out by irradiating the liquid photocurable resin composition that has been jetted out with light or curing the liquid thermosetting resin composition that has been jetted out by heating.

The fused deposition modeling method (FDM method) is a method of forming and depositing a resin layer by pushing out a thermoplastic resin composition melted by heat from a head (nozzle) and then cooling the thermoplastic resin composition.

The selective laser sintering method (SLS method) is a method of forming and depositing a resin layer by jetting out thermoplastic resin powder and then sintering (fusing) the thermoplastic resin powder by a laser.

Among the above, the material jetting method (ink-jet method) and the fused deposition modeling method (FDM method) are preferred in terms of causing heat to be less likely to be generated during the sealing and also enabling the apparatus configuration to be simplified.

Sealing material 17 to be used may be selected in accordance with the type of the three-dimensional molding method. Sealing material 17 may be a curable resin composition containing a curable resin as the sealing resin, or may be a thermoplastic resin composition containing a thermoplastic resin as the sealing resin.

The curable resin composition may be a photocurable resin composition or may be a thermosetting resin composition.

The photocurable resin composition includes a curing agent and a photocurable resin as the sealing resin. Examples of the photocurable resin include photo-radical curable compounds such as a (meth)acrylic ester compound, and photo-cationic curable compounds such as an epoxy resin. Examples of the curing agent of the photo-radical curable compound include photo-radical initiators such as a benzoin compound, an acylphosphine-oxide compound, and benzophenone compound, and acetophenones. Examples of the curing agent of the photo-cationic curable compound include photo-cationic initiators such as a photoacid generator.

The thermosetting resin composition contains a curing agent and a thermosetting resin as the sealing resin. Examples of the thermosetting resin include an epoxy resin. Examples of the curing agent of the thermosetting resin include acid anhydrides, an amine compound, and a phenolic compound.

The thermoplastic resin composition contains a thermoplastic resin as the sealing resin. Examples of the thermoplastic resin include polylactic acid (PLA resin), an acrylonitrile-butadiene-styrene copolymer (ABS resin), polyolefin, polyester, polyamide, polyimide, polyether ketone, polybenzoxazole, and an acrylic resin.

Sealing material 17 is preferred to be a thermosetting resin composition or a photocurable resin composition in terms of mechanical strength, heat resistance, water vapor permeability, and the like. The thermosetting resin used in the thermosetting resin composition or the photocurable resin used in the photocurable resin composition is preferred to be at least one type selected from a group consisting of an epoxy resin, a polyimide resin, and a urea resin. Meanwhile, sealing material 17 is preferred to be a photocurable resin composition or a thermoplastic resin composition in terms of causing heat to be less likely to be generated during the sealing.

The photocurable resin composition, the thermosetting resin composition, and the thermoplastic resin composition may each further include an insulating filling agent such as a ceramic filler and an inorganic filler, as necessary, in terms of suppressing the warp in obtained sealed bodies 21 even more and improving the reliability and the yield of semiconductor package 27 or 27' (see FIGS. 1H and 1I) even more, for example, by increasing the heat resistance and reducing the coefficient of linear expansion of sealing layer 19 after the curing or solidifying.

As described above, sealing material 17 may further contain a filling agent. However, the content percentage of the filling agent in sealing material 17 is preferred to be 10 mass % or less, more preferred to be 5 mass % or less, and further preferred to be 1 mass % or less with respect to the total mass of sealing material 17 in terms of easily suppressing the clogging in the apparatus and preventing the ejection property from being impaired when sealing material 17 is applied to semiconductor chips 13 in the three-dimensional molding method.

Examples of the filling agent include silicate such as talc, baked clay, unbaked clay, mica, and glass, oxide such as titanium oxide, alumina, fused silica (fused spherical silica, fractured fused silica), and crystalline silica powder, carbonate such as calcium carbonate, magnesium carbonate, and hydrotalcite, hydroxides such as aluminum hydroxide, magnesium hydroxide, and calcium hydroxide, sulfate or sulfite such as barium sulfate, calcium sulfate, and calcium sulfite, borate such as zinc borate, barium metaborate, aluminum borate, calcium borate, and sodium borate, and nitride such as aluminum nitride, boron nitride, and silicon nitride.

In terms of easily forming sealing layers 19 whose glass transition temperature is high while suppressing the clogging in the apparatus in the three-dimensional molding method, it is preferred that the sealing resin contained in sealing material 17 be an epoxy resin and the content percentage of the filling agent (filler) be 10 mass % or less with respect to the total mass of sealing material 17, and it is more preferred that the sealing resin be an epoxy resin and the content percentage of the filling agent (filler) be 5 mass % or less with respect to the total mass of sealing material 17.

The coefficient of viscosity of sealing material 17 when sealing material 17 is ejected from the apparatus in the three-dimensional molding method is preferred to be 1 mPa·s to 20 mPa·s. When the coefficient of viscosity of sealing material 17 is in the abovementioned range, the clogging of the apparatus in the three-dimensional molding method is easily suppressed, and hence the ejection property easily becomes satisfactory and sealing layer 19 is easily formed in a desired shape.

(Third Step)

Figure 1E:
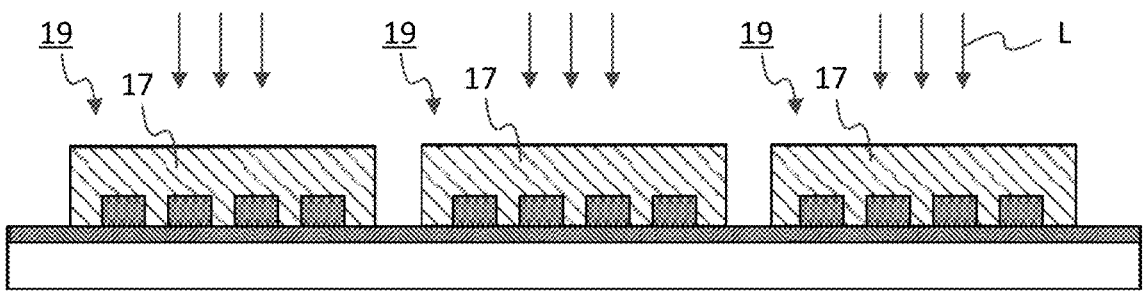

Obtained sealing layers 19 are cured or solidified (see FIG. 1E).

Sealing layers 19 may be cured by photo-curing or thermal curing. In other words, when sealing layers 19 are formed from a photocurable resin composition, sealing layers 19 are irradiated with light, to thereby be cured (see FIG. 1E). When sealing layers 19 are formed from a thermosetting resin composition, sealing layers 19 are heated, to thereby be cured.

Sealing layers 19 may be solidified by solidifying by cooling. In other words, when sealing layers 19 are formed from a thermoplastic resin composition, sealing layers 19 are solidified by cooling.

The glass transition temperature of sealing layers 19 after the curing or solidifying is preferred to be 110° C. or more, more preferred to be 150° C. or more, and further preferred to be 200° C. or more.

The glass transition temperature can be measured by a method below. In other words, a test piece formed of cured or solidified sealing material 17 with a width of 4 mm and a length of 20 mm is prepared. TMA measurement of the glass transition temperature of the test piece is performed with use of a thermomechanical analyzer (TMA-50) made by Shimadzu Corporation with the measurement condition of a temperature range from 25° C. to 350° C., a temperature rising rate of 5° C./minute, a load of 14 g/mm$^2$, and a tension mode. The glass transition temperature (Tg) can be specified from the inflection point of the obtained temperature-test piece elongation curve.

The glass transition temperature of sealing layer 19 after the curing or solidifying can be mainly adjusted by the composition of sealing material 17. In order to set the glass transition temperature of sealing layer 19 after the curing or solidifying to a certain temperature or more, it is preferred that, for example, the curable resin composition be selected as sealing material 17 or the filling agent (filler) be added.

The content percentage of the filling agent in sealing layers 19 is preferred to be 50 mass % to 95 mass %, and more preferred to be from 60 mass % to 90 mass % with respect to the total mass of sealing layer 19. When the contained amount of the filling agent is within the abovementioned range, the deterioration of semiconductor chips 13 due to moisture in the atmosphere is suppressed to a high degree and the generation of cracks is easily suppressed.

Note that sealing layers 19 containing the filling agent may be formed by applying sealing material 17 containing the filling agent by a three-dimensional molding method, or may be formed by applying the filling agent around semiconductor chips 13 in advance and further applying sealing material 17 that does not contain the filling agent thereon.

As described above, an intermediate of the semiconductor apparatus including supporting substrate 11, plurality of semiconductor chips 13 disposed on supporting substrate 11, and plurality of sealing layers 19 disposed at intervals, each sealing layer 19 containing one or more semiconductor chips 13 embedded in sealing material 17 is obtained.

(Fourth Step)

Figure 1F:
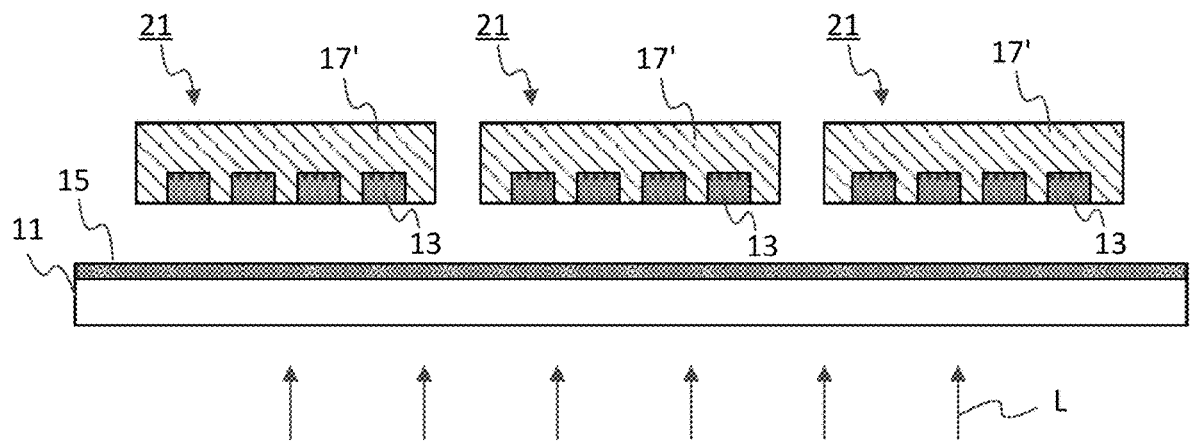
FIGS. 1F to 1I illustrate an example of a method for producing a semiconductor apparatus according to an embodiment.

Sealed bodies 21 are obtained by removing cured or solidified sealing layers 19 of the obtained intermediate from supporting substrate 11 (see FIG. 1F).

The method for removing cured or solidified sealing layers 19 from supporting substrate 11 is not particularly limited. For example, when adhesive sheet 15 is a photo-curable adhesive sheet, cured or solidified sealing layers 19 are removed by reducing the adhesive force by irradiating adhesive sheet 15 with light (see FIG. 1F). When adhesive sheet 15 is a thermally-expandable adhesive sheet, cured or solidified sealing layers 19 are removed by reducing the adhesive force by heating adhesive sheet 15.

Obtained sealed body 21 includes one or more semiconductor chips 13, and a layer formed of cured or solidified sealing material 17' in which the entirety of one or more semiconductor chips 13 except for front surfaces 13A thereof are embedded.

(Other Steps)

Figure 1G:
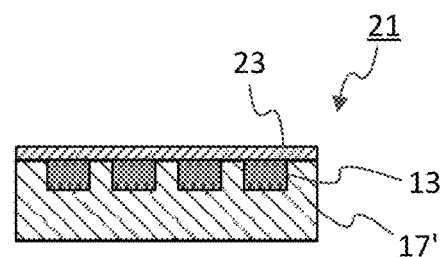

Re-distribution layer 23 may be formed on a surface of obtained sealed body 21 on which one or more semiconductor chips 13 are exposed (a step of forming re-distribution layer 23, see FIG. 1G).

Re-distribution layer 23 includes a rewiring portion (not shown) and a rewiring insulating layer (not shown).

The material of the rewiring portion may be a metal material generally used for wiring, and examples thereof include copper and aluminum.

The material of the rewiring insulating layer may be resins such as an epoxy resin, polyolefin, an acrylic resin, polyester, an ABS resin, polyimide, polyether ketone, and polybenzoxazole. Among the above, a curable resin whose glass transition temperature after the curing is 110° C. or more, preferably 150° C. or more, more preferably 200° C. or more is preferred, and examples thereof include an epoxy resin, thermosetting polyolefin, polyimide, polyether ketone, and polybenzoxazole.

The glass transition temperature of the cured product of the curable resin can be measured by a method similar to that for the glass transition temperature of cured or solidified sealing layers 19.

The rewiring insulating layer may further include an insulating filling material such as a ceramic filler and an inorganic filler, as necessary, in terms of suppressing the warp of semiconductor package 27 or 27' (see FIG. 1H and FIG. 1I) and improving the reliability and the yield of semiconductor package 27 or 27' by increasing the heat resistance and reducing the coefficient of linear expansion, and in terms of reducing the permittivity of the material and reducing transmission loss.

The method for forming re-distribution layer 23 is not particularly limited, and may be a semi-additive method, a subtractive method, a three-dimensional molding method, or the like. Among the above, the three-dimensional molding method is preferred. By forming re-distribution layer 23 by a three-dimensional molding method, the generation of heat when re-distribution layer 23 is formed can be reduced, and hence the warp in sealed bodies 21 and the misalignment of semiconductor chips 13 may be suppressed even more. The formation of detailed wiring that has been difficult to form becomes possible, and the designs of sealed bodies 21 are easily changed, as necessary, for each sealed body 21. For example, the wiring portion can be formed from a material jetting method (ink-jet method) using a metallic paste such as a copper paste, and a selective metal laser sintering method (SLS method) using metal microparticles of gold, silver, copper, nickel, and the like.

Figure 1H:
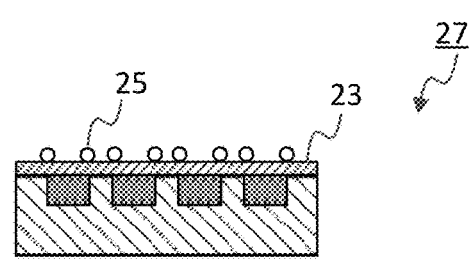

A step of forming bumps 25 on the surface of obtained sealed body 21 on which one or more semiconductor chips 13 are exposed or re-distribution layer 23 may be further performed (a step of forming bumps 25, see FIG. 1H). The material of the bumps may be a well-known metal material generally used for bumps.

A step of forming ground wire (not shown) on the surface of obtained sealed body 21 on which one or more semiconductor chips 13 are exposed so that the ground wire is formed on the outer peripheries of one or more semiconductor chips 13 may be further performed (a step of forming ground wire, not shown).

The material of the ground wire may be a well-known metal material generally used for wiring, and examples thereof include copper and aluminum.

The method for forming the ground wire is not particularly limited, but is preferred to be a three-dimensional molding method because the generation of heat when the wiring is formed can be reduced and detailed wiring can be formed. Specifically, the ground wire can be formed from a material jetting method (ink-jet method) using a metallic paste such as a copper paste, and a selective metal laser sintering method (SLS method) using metal microparticles of gold, silver, copper, nickel, and the like.

A step of forming an electromagnetic wave shield layer (not shown) on at least one portion of a surface of obtained sealed body 21 on which one or more semiconductor chips 13 are not exposed may be further performed (a step of forming an electromagnetic wave shield layer, not shown).

The material of the electromagnetic wave shield layer may be a metal material generally used for an electromagnetic wave shield, and examples thereof include silver, copper, gold, aluminum, magnesium, tungsten, cobalt, zinc, nickel, iron, platinum, tin, chromium, lead, titanium, manganese, and stainless steel. Among the above, silver, copper, gold, and aluminum that have low resistivity are preferred.

The method for forming the electromagnetic wave shield layer is not particularly limited, but is preferred to be a three-dimensional molding method. Specifically, the electromagnetic wave shield layer can be formed from a material jetting method (ink jet method) using a metallic paste, and a selective metal laser sintering method (SLS method) using a metal microparticle.

Figure 1I:
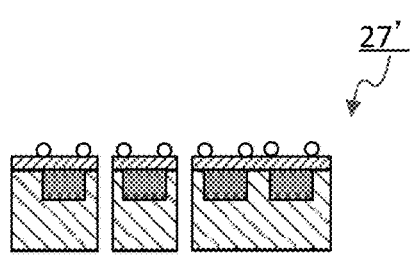

Sealed body 21 obtained as described above may be directly made into semiconductor package 27 (semiconductor apparatus) (see FIG. 1H), or may be made into semiconductor packages 27' (semiconductor apparatuses) by further dividing sealed body 21 into each of semiconductor chips 13 or each of packages formed from a plurality of semiconductor chips 13 (see FIG. 1I).

According to this embodiment, as described above, plurality of sealing layers 19 are formed at intervals. As a result, the contact area between each of sealing layers 19 and supporting substrate 11 can be reduced. Sealing layers 19 are formed by the three-dimensional molding method. As a result, the generation of heat when sealing layers 19 are formed can be reduced as compared to the mold molding method of the related art. As a result, the warp in sealed bodies 21 and the misalignment of semiconductor chips 13 (die shift) due to the difference in the coefficient of thermal expansion between supporting substrate 11 and sealing layers 19 can be suppressed.

Note that, according to this embodiment, an example in which one sealing layer 19 seals plurality of semiconductor chips 13 so as to include plurality of semiconductor chips 13 is described in the second step. However, the present invention is not limited thereto, and one sealing layer 19 may seal one semiconductor chip 13 so as to include one semiconductor chip 13.

According to this embodiment, an example in which a frame body is not used is described. However, the present invention is not limited thereto, and a frame body may be further used.

Figure 3A:
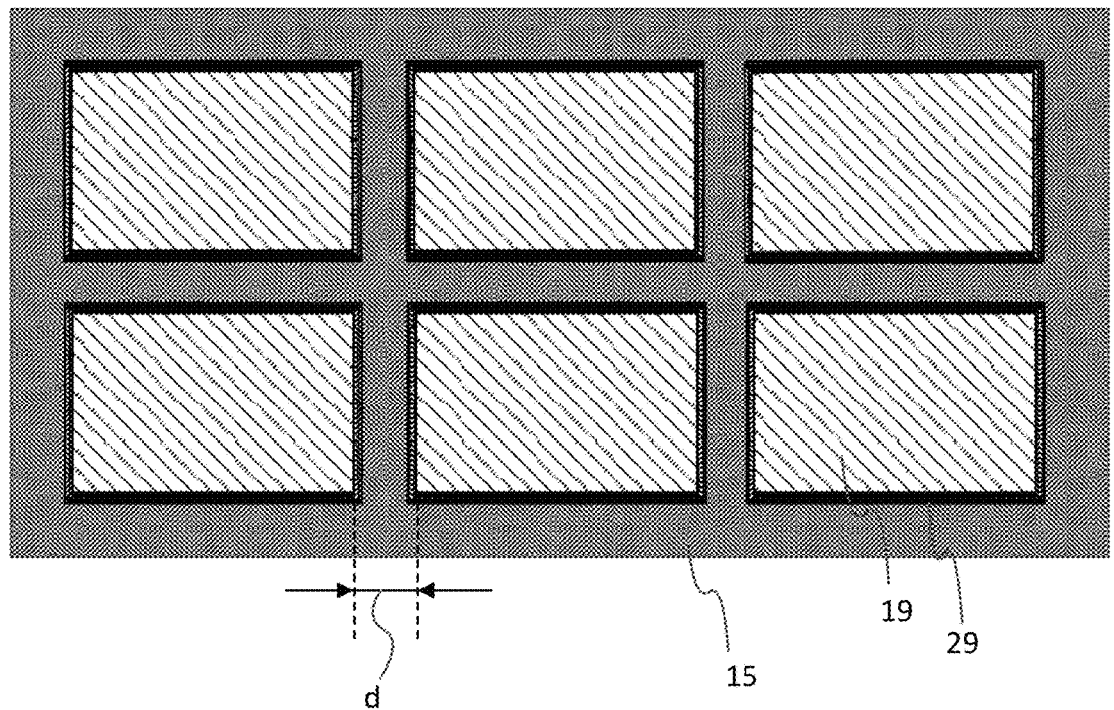
FIGS. 3A and 3B illustrate another example of a step of forming the plurality of sealing layers.
Figure 3B:
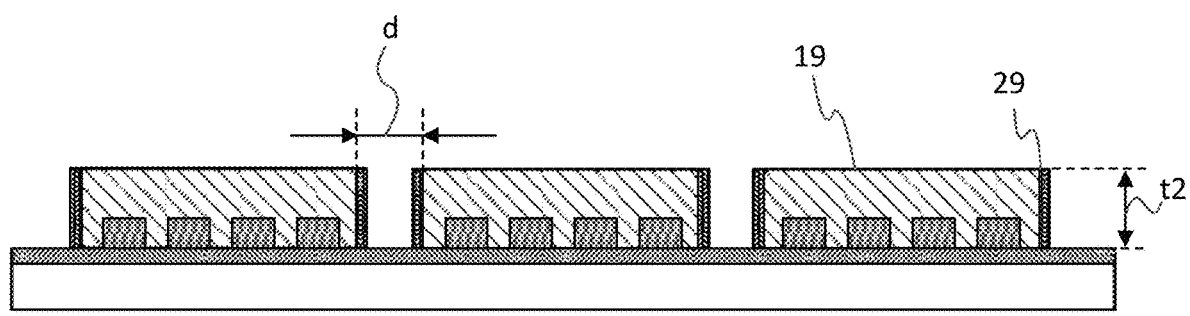

FIGS. 3A and 3B illustrate another example of a step of forming plurality of sealing layers 19. Out of FIGS. 3A and 3B, FIG. 3A is a plan view and FIG. 3B is a cross-sectional view. As illustrated in FIGS. 3A and 3B, a step of forming frame bodies 29 that surround the outer peripheries of sealing layers 19 may further be performed. Frame bodies 29 may be formed before or after the second step. Among the above, frame bodies 29 are preferred to be formed before the second step in terms of easily suppressing the deformation of sealing layers 19 due to heat generated at the time of sealing.

In other words, it is preferred that, after forming plurality of frame bodies 29 surrounding semiconductor chips 13 on supporting substrate 11 on which plurality of semiconductor chips 13 are fixed, sealing layers 19 be formed by applying sealing material 17 on the inner side of frame bodies 29 in the second step.

The method for forming frame bodies 29 may be a method of disposing frame bodies that are molded in advance, or may be a method of directly forming frame bodies 29 on supporting substrate 11 by coating.

Frame bodies 29 may have a function of suppressing deformation caused by the thermal expansion of sealing layers 19. Frame bodies 29 may also have a function of causing sealing layers 19 to be less likely to stick to each other even when the minimum interval between adjacent sealing layers 19 is small and sealing layers 19 may easily stick to each other by thermal expansion.

Frame bodies 29 are preferred to include a material whose linear expansion coefficient at the temperature of 60° C. to 250° C. is 35 ppm/K or less, or a resin whose tensile modulus of elasticity at the temperature of 60° C. to 250° C. is less than the tensile modulus of elasticity of sealing material 17 after the curing or solidifying by 0.5 GPa or more.

When frame bodies 29 include a material whose linear expansion coefficient is 35 ppm/K or less at the temperature of 60° C. to 250° C., the force of sealing layer 19 that is about to thermally expand can be suppressed. As a result, the warp in sealed bodies 21 and the misalignment of semiconductor chips 13 can be suppressed even more.

The coefficient of linear expansion of the material can be measured by a method below. In other words, a sample piece (about 30 μm, length 20 mm) faulted of the material to be measured is prepared. Next, by a thermomechanical analyzer (TMA-50, made by Shimadzu Corporation), a constant load (14 g for 1 mm² of the cross section of the film) is applied to both ends of the sample piece, and the linear expansion coefficient (unit: ppm/K) is measured from the elongation (shrinkage) when the temperature is changed.

Examples of a material whose linear expansion coefficient at the temperature of 60° C. to 250° C. is 35 ppm/K or less include metal materials such as aluminum (23 ppm/K), iron (12 ppm/K), tungsten (4.3 ppm/K), chromium (6.8 ppm/K), carbon steel (10.8 ppm/K), stainless steel (10 ppm/K to 17 ppm/K), nickel (12.8 ppm/K), copper (16.8 ppm/K), and magnesium (25.4 ppm/K), and inorganic materials such as Pyrex® glass (3.2 ppm/K), silicon carbide (6.6 ppm/K), hard glass (8.5 ppm/K), and silicon (24 ppm/K).

Meanwhile, when frame bodies 29 include a resin whose tensile modulus of elasticity at the temperature of 60° C. to 250° C. is lower than the tensile modulus of elasticity of the sealing material after the curing or solidifying by 0.5 GPa or more, the force of the thermal expansion of sealing layer 19 can be absorbed and alleviated. As a result, the warp in sealed bodies 21 and the misalignment of semiconductor chips 13 can be suppressed even more.

The tensile modulus of elasticity of the resin can be measured by a method below. In other words, a sheet-like test piece with a thickness of 1 mm formed of the resin to be measured is prepared. The tensile modulus of elasticity (GPa) of the test piece is measured by a tensile testing apparatus under an atmosphere at a temperature of any of the temperature of 60° C. to 250° C. and the relative humidity of 50% based on ASTM D638.

Examples of a resin whose tensile modulus of elasticity at the temperature of 60° C. to 250° C. is less than the tensile modulus of elasticity of the sealing material after the curing or solidifying by 0.5 G Pa or more include elastomers such as butadiene rubber, isoprene rubber, silicon rubber, styrene-butadiene rubber, chloroprene rubber, nitrile rubber, butyl rubber, ethylene-propylene rubber, acrylic rubber, chlorosulfonated polyethylene rubber, fluoro rubber, hydrogenated nitrile rubber, and epichlorohydrin rubber.

Thickness t2 of frame body 29 may be the same as or different from thickness t1 of sealing layer 19, but is preferred to be the same as thickness t1 of sealing layer 19 in ter us of improving the handleability and the external appearance of sealed body 21 (see FIG. 3B).

When frame bodies 29 are formed on the outer peripheries of sealing layers 19, minimum width d of the interval between sealing layer 19 and sealing layer 19 that are adjacent to each other corresponds to a width obtained by adding the wall thickness of two adjacent frame bodies 29 and the interval between frame bodies 29 together (see FIG. 3B).

Frame bodies 29 may be removed in a subsequent step, or may be left to be mounted on semiconductor packages 27 or 27' without being removed. When frame bodies 29 are formed from a metal material and the like, a heat radiation property and an electromagnetic-wave shielding property may be further applied to obtained semiconductor packages 27 or 27' by leaving frame bodies 29 to be mounted on semiconductor packages 27 or 27' without removing frame bodies 29.

As described above, by further forming frame bodies 29, the warp in sealed bodies 21 and the misalignment of semiconductor chips 13 when sealed bodies 21 are obtained can be suppressed even more. By forming frame bodies 29 by a metal material and leaving frame bodies 29 to be mounted on packages without removing frame bodies 29, the heat radiation property and the electromagnetic-wave shielding property of obtained semiconductor packages 27 or 27' can be increased.

EXAMPLE (Simulation)

The maximum value of the moving distance of semiconductor chips 13 when the materials of supporting substrates 11, semiconductor chips 13, and sealing layers 19 are combined as below, heated from room temperature (24° C.) to 150° C., and then cooled to room temperature were calculated by a finite element method with use of analysis software ANSYS.

The range of the percentage (d/W×100) of minimum value d of the interval between sealing layers 19 with respect to maximum width W of sealing layer 19 was specified in consideration of the fact that the contact between sealing layers 19 can be suppressed when interval d between adjacent sealing layers 19 exceeds the maximum value of the moving distance of semiconductor chips 13 and the moving distance of semiconductor chips 13 is proportional to the maximum width (W) of each of sealing layers 19.

The analytical model was obtained by disposing a plurality of silicon chips (semiconductor chips 13) (size: 10 mm×10 mm×500 μm) on a 12-inch wafer (supporting substrate 11) at intervals of 5 mm, and sealing the entire surface of the 12-inch wafer with an epoxy resin (sealing material 17) (sealing thickness of 700 μm). The simulation was performed on the condition below.

The material of supporting substrate 11: an SUS substrate (Young's modulus: 197000 MPa, Poisson's ratio: 0.30, linear expansion coefficient: 17.3 ppm/° C.)

The material of sealing layers 19: an epoxy resin (Young's modulus: 3000 MPa, Poisson's ratio: 0.34, linear expansion coefficient: 8 ppm/° C. (a temperature less than Tg), 17.3 ppm/° C. (a temperature exceeding Tg), curing temperature: 150° C.)

The material of semiconductor chips 13: silicon (Young's modulus: 131000 MPa, Poisson's ratio: 0.27, linear expansion coefficient: 2.62 ppm/° C.)

It was computed that the maximum value of the moving distance of semiconductor chips 13 (in other words, the moving distance of semiconductor chip 13 in the position that is the farthest from the center of the wafer (supporting substrate 11)) in the cooling process is 0.27 mm, and the percentage of the maximum value of the moving distance of semiconductor chips 13 with respect to the maximum width (W) of sealing layer 19 is 0.18%. From the above, it was understood that the contact between adjacent sealing layers 19 can be suppressed to a high degree when the interval between adjacent sealing layers 19 is set so that the percentage (d/W×100) of minimum value d of the interval between two adjacent sealing layers 19 with respect to maximum width W of sealing layer 19 is 0.19% or more.

This application claims priority from Japanese Patent Application No. 2017-093599 filed on May 10, 2017. The contents described in the specification and the drawings of the application are incorporated herein by reference in their entirety.

INDUSTRIAL APPLICABILITY

According to the present invention, a method for producing a semiconductor apparatus that may suppress a warp in a sealed body and the misalignment of a plurality of semiconductor chips when the sealed body is obtained by collectively sealing the semiconductor chips, and may suppress the reduction of the handleability of the sealed body and the reliability of the semiconductor apparatus after the sealed body is obtained can be provided.

REFERENCE SIGNS LIST

11 Supporting substrate
13 Semiconductor chip
15 Adhesive sheet
17 Sealing material
17' Cured or solidified sealing material
19 Sealing layer
21 Sealed body
23 Re-distribution layer
25 Bump
27, 27' Semiconductor package
29 Frame body
W Maximum width (of sealing layer 19)
d Minimum width of interval (between sealing layers 19)
L Light

The invention claimed is:

1. A method for producing a semiconductor apparatus, the method comprising:
   a first step of fixing a plurality of semiconductor chips on a supporting substrate so that circuit surfaces of the plurality of semiconductor chips face the supporting substrate;
   a second step of forming, at intervals, a plurality of frame bodies each surrounding one or more semiconductor chips on the supporting substrate and forming a sealing layer by applying a sealing material containing a sealing resin only to an inner side of each of the frame bodies by a three-dimensional molding method so as to form the sealing layer which is being divided into a plurality of parts by an open gap in the sealing layer provided between adjacent parts of the sealing layer, wherein each of the parts of the sealing layer contains one or more semiconductor chips covered with the sealing material, and wherein each of the frame bodies is made of a material containing a material whose coefficient of linear expansion at a temperature of 60° C. to 250° C. is 35 ppm/K or less;
   a third step of curing or solidifying the sealing layer; and
   a fourth step of obtaining sealed bodies by removing the cured or solidified sealing layer from the supporting substrate,
   wherein the sealed bodies each comprise a plurality of the semiconductor chips; and
   the method further comprises cutting a place between the plurality of the semiconductor chips included in each of the sealed bodies.

2. The method for producing the semiconductor apparatus according to claim 1, wherein, in the second step, a percentage of a minimum width of the open gap in adjacent two of the parts of the sealing layer based on a maximum width of each of the parts of the sealing layer is 0.19% to 10% when the supporting substrate is seen in plan view.

3. A method for producing a semiconductor apparatus, the method comprising:
   a first step of fixing a plurality of semiconductor chips on a supporting substrate so that circuit surfaces of the plurality of semiconductor chips face the supporting substrate;
   a second step of forming, at intervals, a plurality of frame bodies each surrounding one or more semiconductor chips on the supporting substrate, and forming a sealing layer by applying a sealing material containing a sealing resin only to an inner side of each of the frame bodies by a three-dimensional molding method so as to form the sealing layer which is being divided into a plurality of parts by an open gap in the sealing layer provided between adjacent parts of the sealing layer, wherein each of the parts of the sealing layer contains one or more semiconductor chips covered with the sealing material,
   wherein the frame bodies are made of a material containing a resin whose tensile modulus of elasticity at a temperature of 60° C. to 250° C. is less than a tensile modulus of elasticity of the sealing material after curing or solidifying by 0.5 GPa or more;

a third step of curing or solidifying the sealing layer; and a fourth step of obtaining sealed bodies by removing the cured or solidified sealing layer from the supporting substrate, wherein the sealed bodies each comprise a plurality of the semiconductor chips; and the method further comprises cutting a place between the plurality of the semiconductor chips included in each of the sealed bodies.

4. The method for producing the semiconductor apparatus according to claim 1, wherein:

the sealing material is allowed to further contain a filling agent; and a content percentage of the filling agent with respect to a total mass of the sealing material is 10 mass % or less.

5. The method for producing the semiconductor apparatus according to claim 1, wherein a coefficient of viscosity of the sealing material when the sealing material is applied on the semiconductor chips by the three-dimensional molding method is 1 mPa·s to 20 mPa·s.

6. The method for producing the semiconductor apparatus according to claim 1, wherein a glass transition temperature of the sealing layer is 110° C. or more.

7. The method for producing the semiconductor apparatus according to claim 1, wherein the sealing resin is at least one member selected from a group consisting of an epoxy resin, a polyimide resin, and a urea resin.

8. The method for producing the semiconductor apparatus according to claim 1, further comprising forming, by the three-dimensional molding method, a re-distribution layer on a surface of each of the sealed bodies, wherein each of the sealed bodies has one or more semiconductor chips exposed on the surface.

9. The method for producing the semiconductor apparatus according to claim 1, further comprising forming, by the three-dimensional molding method, ground wire on outer peripheries of the semiconductor chips on a surface of each of the sealed bodies, wherein each of the sealed bodies has one or more semiconductor chips exposed on the surface.

10. The method for producing the semiconductor apparatus according to claim 1, further comprising forming, by the three-dimensional molding method, an electromagnetic wave shield layer on at least one portion of a surface of each of the sealed bodies, wherein each of the sealed bodies has no semiconductor chips exposed on the surface.

11. The method according to claim 1, wherein in the second step, the sealing material is applied on the semiconductor chips by a stereo lithography method, a material jetting method, a fused deposition modeling method, or a selective laser sintering method.

\* \* \* \* \*